United States Patent
Bammes et al.

(10) Patent No.: US 8,809,781 B1
(45) Date of Patent: Aug. 19, 2014

(54) METHOD OF ELECTRON BEAM IMAGING OF A SPECIMEN BY COMBINING IMAGES OF AN IMAGE SEQUENCE

(71) Applicant: Direct Electron, LP, San Diego, CA (US)

(72) Inventors: Benjamin Eugene Bammes, Pearland, TX (US); Liang Jin, San Diego, CA (US)

(73) Assignee: Direct Electron, LP

( * ) Notice: Subject to any disclaimer, the term of this patent is extended or adjusted under 35 U.S.C. 154(b) by 0 days.

(21) Appl. No.: 14/193,159

(22) Filed: Feb. 28, 2014

Related U.S. Application Data

(60) Provisional application No. 61/770,459, filed on Feb. 28, 2013.

(51) Int. Cl.
*H01J 37/26* (2006.01)
*H01J 37/244* (2006.01)

(52) U.S. Cl.
CPC .............. *H01J 37/244* (2013.01); *H01J 37/26* (2013.01)
USPC ........................... 250/307; 250/306; 250/310

(58) Field of Classification Search
CPC ........... H01J 37/22; H01J 37/26; H01J 37/28; H01J 2237/26; H01J 2237/2802; H01J 2237/2803
USPC ................. 250/305, 306, 307, 309, 310, 311
See application file for complete search history.

(56) References Cited

U.S. PATENT DOCUMENTS

2010/0303334 A1 * 12/2010 Kitamura et al. ............. 382/141

* cited by examiner

*Primary Examiner* — Nicole Ippolito
(74) *Attorney, Agent, or Firm* — Stetina Brunda Garred & Brucker

(57) ABSTRACT

A method of imaging of a specimen exposed to an electron beam signal includes acquiring an image sequence of sequential images of the specimen. Each subsequent image in the image sequence represents increased cumulative electron beam signal exposure on the specimen. The method includes collecting cumulative exposure data for each image of the image sequence. The method includes applying a low-pass image processing filter to the images of the image sequence using the cumulative exposure data corresponding to each image to which the filter is being applied to produce processed images. The method includes combining the processed images to produce a final image. A method of imaging is also provided that includes selectively discarding images in the image sequence.

19 Claims, 4 Drawing Sheets

METHOD OF ELECTRON BEAM IMAGING OF A SPECIMEN BY COMBINING IMAGES OF AN IMAGE SEQUENCE

CROSS-REFERENCE TO RELATED APPLICATIONS

This application is a non-provisional patent application and claims priority to and the benefit of U.S. Provisional Patent App. Ser. No. 61/770,459, filed on Feb. 28, 2013, the entire contents of which are incorporated herein by reference.

STATEMENT RE: FEDERALLY SPONSORED RESEARCH/DEVELOPMENT

The present invention was supported by Grant No. R44GM103417 awarded by the National Institutes of Health.

BACKGROUND

The present invention relates in general to electron beam particle imaging, and more particularly, to a method of electron beam imaging of a specimen by combining images of an image sequence.

TEM (transmission electron microscopy) performance lags considerably behind its theoretical limit based on the physics of electron interactions with matter, especially in cases where low-dose imaging is required because of specimen sensitivity to damage by the electron beam. Multiple factors can reduce resolution and signal-to-noise ratio (SNR) in TEM images, including a number of factors related to electron microscopy instrumentation and the use of non-ideal electron detectors. Taken together, however, instrumentation factors explain only a small fraction of the gap between theoretically attainable and actual performance. Dynamic specimen processes, such as drift, beam-induced motion, charging, radiation damage, generally contribute a significant portion of the non-idealities that reduce overall system performance. Additionally, non-ideal electron detectors are a significant final factor explaining the gap between actual and theoretical performance in TEM.

Radiation damage to a specimen refers to the breakdown of the chemical structure of a specimen under observation as a result of interaction with the electron beam. Inelastic scattering of the electrons on the specimen causes excitation of specimen valence electrons resulting in radiation damage, which includes bond rupture, free radical formation, liberation of hydrogen atoms, changes in the physical properties of the specimen (e.g., density), and structural rearrangements. Generally, damage is cumulative, meaning that as the total exposure accumulates on the specimen, damage continues to increase, first affecting high-resolution features and then affecting lower-resolution features as exposure continues to accumulate. Cumulative damage may also depend on dose rate, meaning that 20 electrons per square Ångström delivered over a short period of time (e.g., one second) may cause more damage than the same number of electrons delivered over a longer period of time (e.g., five seconds).

Sensitive specimens, such as specimens of biological importance held in natural states of hydration (frozen in amorphous ice), are imaged in the electron microscope using both a low total electron exposure (total number of electrons used to form an image, e.g., 20 electrons per square Ångström on the specimen) and a low electron exposure rate (number of electrons per unit time, per unit area, used to illuminate a specimen for acquisition of an image, e.g., 10 electrons per square Ångström per second on the specimen). However, in such cryo-microscopy of biological specimens, dynamic specimen processes are particularly detrimental, causing either non-isotropic resolution loss (i.e., specimen drift) or overall degradation of the SNR in each image (e.g., beam-induced motion, charging, radiation damage, etc.). Moreover, such dynamic specimen processes are exasperated in the context of sequential imaging in a "movie" mode with extended electron beam exposure.

Photographic film or CCD-based electronic cameras used to record TEM images collect a single image representing the entire electron exposure of the specimen. A sequence of multiple images of a specimen may be acquired by either manually or automatically collecting multiple images of the specimen, one after another, with some amount of dead time between each image acquisition. Alternatively, CMOS-based electronic cameras can collect a sequence of images of the specimen, with negligible dead time between each image, so that an electron exposure is intrinsically fractionated into multiple images. In either case, a sequence of multiple images of a specimen may be combined (for example, by addition) to form a single static specimen image.

Recently, the inventors, among others, developed a TEM camera system based on a specially developed active pixel sensor (APS) for detection of electrons by direct bombardment on the sensor, called the Direct Detection Device (DDD). The DDD has significantly higher sensitivity and resolution than other electronic cameras and offers a large field of view similar to photographic film. The architecture of this DDD camera also allows for continuous streaming of full-resolution, full-frame images at up to 40 frames per second, with little or no dead time between consecutive frames.

Accordingly, there exists a need in the art for an improved imaging technique in comparison to the prior art.

BRIEF SUMMARY

According to an aspect of the present invention, there is provided a method of imaging of a specimen exposed to an electron beam signal. The method includes acquiring an image sequence of sequential images of the specimen. Each subsequent image in the image sequence represents increased cumulative electron beam signal exposure on the specimen. The method further includes collecting cumulative exposure data for each image of the image sequence. The method further includes applying a low-pass image processing filter to the images of the image sequence using the cumulative exposure data corresponding to each image to which the filter is being applied to produce processed images. The method further includes combining the processed images to produce a final image.

According to various embodiments, the method may include exposing the specimen to the electron beam signal. The acquiring of the sequence may be by an electron detector. The electron detector may be a direct bombardment detector. The acquiring of the image sequence may be by using an electron detector to collect a continuous stream of images. The continuous stream of images may be acquired at at least 5 frames per second (fps). The cumulative exposure on the specimen over an entirety of the image sequence may be between 10 and 100 electrons per square Ångström ($e^-/Å^2$). The low-pass image processing filter may be characterized by a filter strength, and the filter strength may be increased for each subsequent image in the image sequence. The low-pass image processing filter may be selectively applied to images of the image sequence. The low-pass image processing filter may not be applied to initial ones of the images of the image sequence.

According to another embodiment, there is provided a method of imaging of a specimen exposed to an electron beam signal. The method includes acquiring an image sequence of sequential images of the specimen. Each subsequent image in the image sequence represents increased cumulative electron beam signal exposure on the specimen. The method further includes selectively discarding images in the image sequence where the images do not have sufficient correspondence with other images in the image sequence. The method further includes combining a remainder of the images to produce a final image.

According to various embodiments, correspondence between images in the image sequence may be determined by comparison of a two-dimensional Fourier transform of the discarded images with a two-dimensional Fourier transform of selected ones of a remainder of the images. In this regard, the method may include comparing a two-dimensional Fourier transform of the discarded images with a two-dimensional Fourier transform of selected ones of a remainder of the images. The discarded images may include images from a beginning of the image sequence. The method may further include exposing the specimen to the electron beam signal. The acquiring of the sequence may be by an electron detector. The electron detector may be a direct bombardment detector. The acquiring of the image sequence may be by using an electron detector to collect a continuous stream of images. The continuous stream of images may be acquired at at least 5 frames per second (fps). The cumulative exposure on the specimen over an entirety of the image sequence may be between 10 and 100 electrons per square Ångström ($e^-/Å^2$).

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the presently preferred embodiment of the invention, and is not intended to represent the only form in which the present invention may be constructed or utilized. Reference throughout the detailed description to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this detailed description are not necessarily all referring to the same embodiment. The following description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments. In the following description, numerous specific details are shown to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described to avoid obscuring aspects of the invention. It is further understood that the use of relational terms such as first and second, and the like are used solely to distinguish one from another entity without necessarily requiring or implying any actual such relationship or order between such entities.

The present invention contemplates high energy particle imaging detection devices, such as an electron beam detection device, which provides adequate sensitivity and frame rate to allow collecting multiple, high quality, images during an exposure with little or no dead time between images. An aspect of the invention includes methods involving processing "movies" from the camera (raw frames continuously streamed during data acquisition) to "correct for" dynamic specimen processes.

Figure 1:
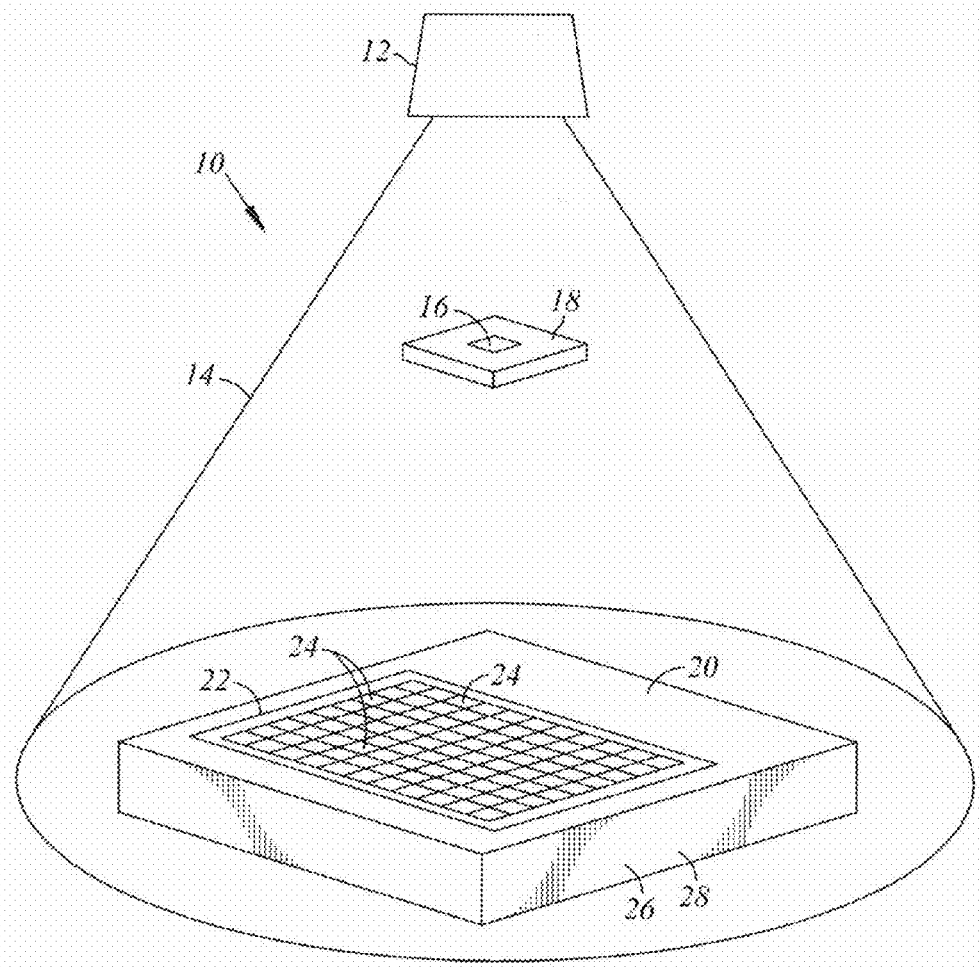
FIG. 1 is a symbolic illustration of a direct bombardment detector having an active pixel array with an incident electron beam.

Referring now to FIG. 1 there is depicted a symbolic illustration of a high-energy particle imaging camera 10. In an embodiment, the camera 10 may be configured to utilize an incident radiation beam, such as an electron beam 14 emanating from an electron beam source 12. The camera 10 is used to capture images of a specimen 16 as supported by the specimen support 18. The specimen 16 is subject to an incident electron beam signal of the electron beam 14. A detector 20 is used to sense high-energy particles. For example, where the detector 20 may be an electron detector. Other detectors may be configured to sense protons, neutrons, and other subatomic particles, x-rays and other ionizing radiation according to those which are well known to one of ordinary skill in the art.

The detector 20 is symbolically illustrated as an active pixel direct bombardment detector. The detector 20 has an array of pixels 22 (with individual pixels denoted as pixels 24). The detector 20 may take the form of any of those devices which are well known to one of ordinary skill in the art. The detector 20 may have a design based upon those teachings of U.S. Pat. No. 7,262,411 entitled "Direct Collection Transmission Electron Microscopy" the complete contents of which are incorporated herein by reference. As such, the detector 20 may be based on active pixel sensors used in direct bombardment mode to achieve direct detection of primary electrons without use of a scintillator screen. The array of pixels 22 may be an active pixel array comprising charge collection diodes that collect secondary electrons generated when a primary electron passes through the thin epitaxial silicon layer in which the p-n junction of each diode is formed. However, it is contemplated that the present invention may utilize images produced using a non-direct type of detector, such as one which does include a scintillator screen. In addition, while the array of pixels 22 is illustrated as a 2D array, it is contemplated that the array of pixels 22 may be a single row type, 3D or other dimensional configuration.

The detector 20 may further include a control device 26 and a sampling device 28. The control device 26 and sampling device 28 may be integrated into a single overall electrical component. The control device 26 is configured to control the electron beam source 12, the array of pixels 22 and the overall functioning of the camera 10. The sampling device 28 is configured to capture and process images based upon the output from the array of pixels 22 and information received from the control device 26 regarding the operation of the electron beam source 12. The control device 26 and the sampling device 28 may be constructed to include hardware, circuitry and software according to those methods which are well known to one of ordinary skill in the art along with those teachings contained herein.

According to an aspect of the present invention, there is provided a method of imaging of the specimen 16 exposed to an electron beam signal. Referring now to the flow diagram of FIG. 2, the method may initially include a step of exposing 100 the specimen 16 to the electron beam signal. The method further includes the step of acquiring 110 an image sequence of sequential images of the specimen 16. Each subsequent image in the image sequence represents increased cumulative electron beam signal exposure on the specimen 16. The method further includes the step of collecting 120 cumulative exposure data for each image of the image sequence. The method further includes the step of applying a low-pass image processing filter to the images of the image sequence using the cumulative exposure data corresponding to each image to which the filter is being applied to produce processed images. The method further includes the step of combining 130 the processed images to produce a final image. As discussed below, the foregoing method of utilizing a low-pass image processing filter is particularly adapted for compensating or correcting for radiation damage upon the specimen 16 that is being imaged.

As the specimen 16 is exposed to the electron beam during imaging, the specimen 16 undergoes changes due to its interaction with the high-energy electrons from the electron beam 14. As the exposure on the specimen 16 continues to accumulate, the structure of the specimen 16 may change (often known as "radiation damage"). These changes may initially affect the fine details (high-resolution information) in the specimen 16. However lower-resolution details may also be increasingly affected as the cumulative exposure on the specimen 16 increases. The present invention recognizes that because damage typically affects high-resolution features before affecting lower-resolution features in specimen 16, the information content varies across spatial frequency at each imaging time-point. In the present invention, image contrast and the SNR at each spatial frequency may be optimized (or at least the increasing effects of radiation damage may be mitigated) by applying the low-pass image processing filter to each individual frame or sum of several frames, with the cut-on frequency for the low-pass image processing filter set based on the expected radiation damage at the corresponding time point. Therefore, frames acquired later have more filtering, since they represent a higher cumulative exposure and thus more radiation damage. As such, it is desirable to progressively increase the filter strength with respect to the sequences of captured images. As used herein the term frame refers to an image captured in a sequence of captured images.

Figure 2:
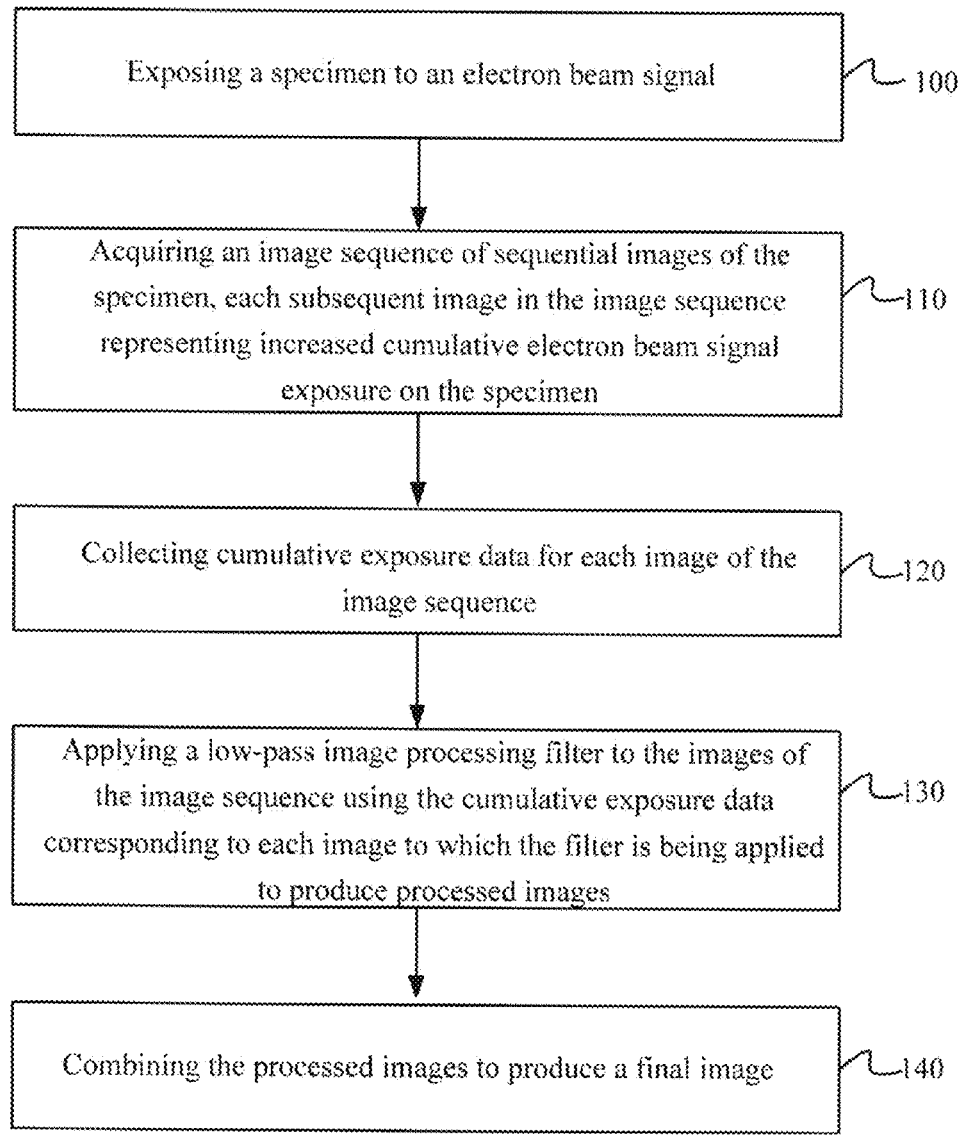
FIG. 2 is a flow diagram of a method of imaging according to an aspect of the invention.
Figure 3:
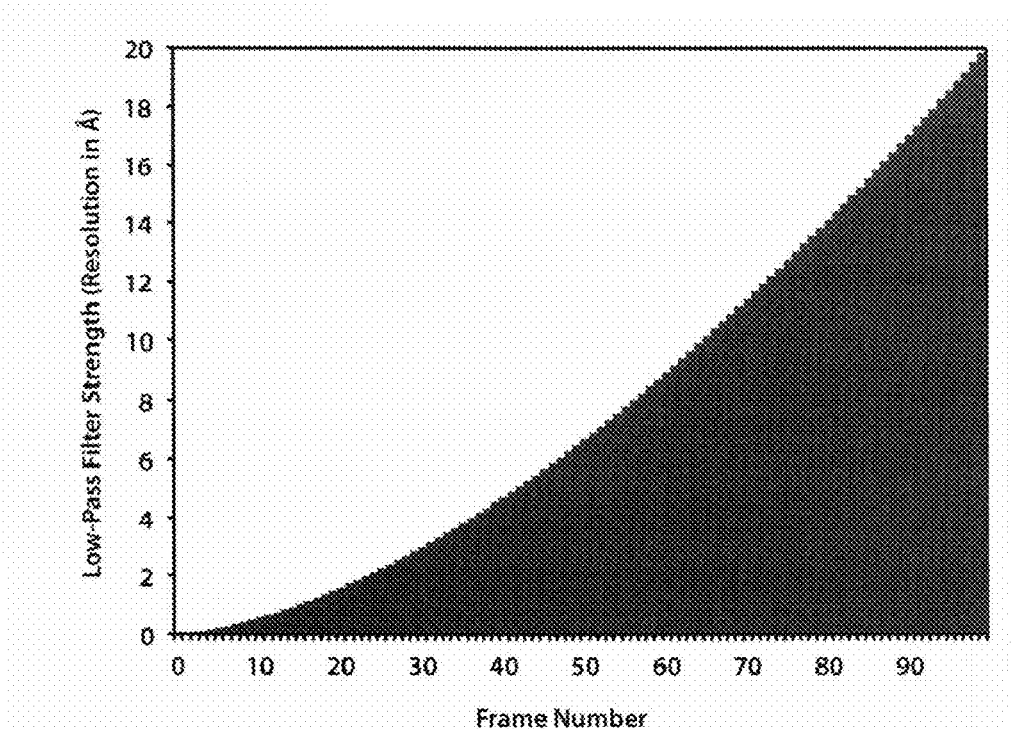
FIG. 3 is an exemplary graph of low-pass filter strength as plotted versus image frame as may be used in conjunction with the method of the flow diagram of FIG. 2.

Referring now to FIG. 3 there is depicted an exemplary graph of low-pass filter strength as plotted versus image frame as may be used in conjunction with the method of the flow diagram of FIG. 2. The low-pass filter strength is measured in the context of resolution in Ångströms. The low-pass image processing filter is characterized by a filter strength. It is observed that the filter strength increases along a curve with the increase of frame or image number. In this regard, the filter strength is increased for each subsequent image in the image sequence. Adjustable properties of low-pass filters include the shape (or type) and the strength (or cut-off frequency). The shape of the low-pass filter is defined by the specific mathematical function used. The low-pass image processing filter may be applied according to those algorithms and techniques which are well known to one of ordinary skill in the art. It is contemplated that the low-pass image processing filter may be selectively applied to images of the image sequence. In this regard, the low-pass image processing filter may not be applied to the initial ones of the images of the image sequence.

The strength of the low-pass filter applied to each image in the image sequence is determined based on its corresponding cumulative exposure on the specimen 16. In general, the rate of damage of a specimen can either be estimated based on radiation damage studies of the exact specimen of interest or based on more general studies of damage rates for similar specimens. For example, in the case of frozen-hydrated biological specimens, the damage rate may be generally estimated based on published damage rates for frozen-hydrated catalase crystal. The damage rate shows the expected resolution that can be expected after various cumulative exposures on the specimen 16. The low-pass filter strength applied to each image in the image sequence may therefore be tuned based on the cumulative specimen exposure so that only the undamaged spatial frequencies on the specimen 16 are retained. The cumulative specimen exposure is typically calculated by multiplying the exposure rate on the specimen 16 by the exposure time for each image in the image sequence. The exposure rate on the specimen 16 corresponds to the electron beam brightness, and can be measured using the screen current from the microscope or by using a Faraday plate to measure the electron flux of the electron beam 14 before it is detected by the detector 20. The exposure time is the time that has elapsed between the beginning of an exposure and acquisition of an image in the image sequence. For direct detection cameras that allow an image sequence to be captured at some frame rate with no dead-time between images, the exposure time can be simply calculated by multiplying the time for each image (which is the mathematical inverse of the frame rate) by the index (sequential numbering) of the image in the image sequence.

According to various embodiments, the step of acquiring 110 of the image sequence may be by an electron detector, such as detector 20. Further, the electron detector is a direct bombardment detector. The acquiring 110 of the image sequence is by using an electron detector to collect a continuous stream of images. The continuous stream of images may be acquired at at least 5 frames per second (fps). The cumulative exposure on the specimen 16 over an entirety of the image sequence may be between 10 and 100 electrons per square Ångström ($e^-/Å^2$).

As mentioned above, the method includes the step of acquiring 110 the image sequence of sequential images of the specimen 16. In the context of the camera 10, this step of acquiring 110 is accomplished "real time" with readout voltages being output by the array of pixels 22 and images captured by the detector 20. The sampling device 28 may then be used to process the image sequence with the camera user getting an output of the any combination of the initial "raw" images, the processed images and/or the final image. However, it is contemplated that the step of acquiring 110 may be done as a data processing function with the raw images having been captured and later provided and therefore acquired. In this respect, one entity may initially operate the camera 10 to produce the image sequence. Subsequently, an aspect of the invention may be accomplished by a method that begins with the step of acquiring 110 the image sequence (albeit not in real-time).

As mentioned above, the method includes the step of collecting 120 cumulative exposure data for each image of the image sequence. In this regard, the sampling device 28 is configured to collect cumulative exposure data.

Figure 4:
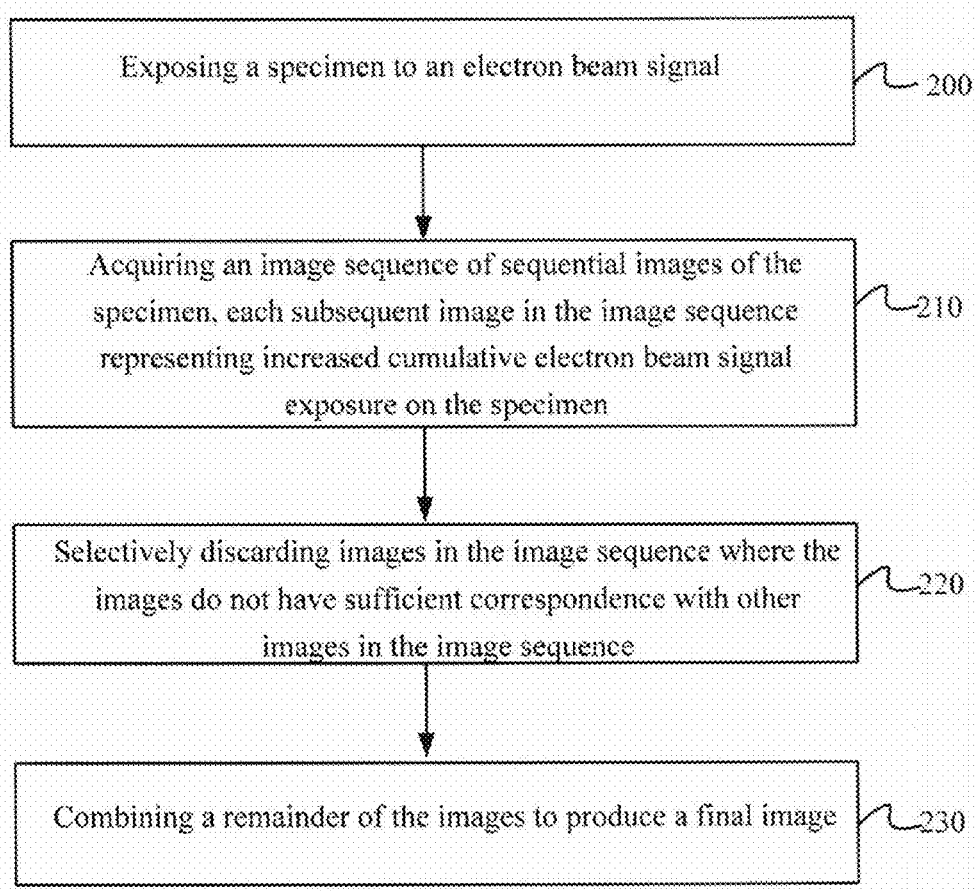
FIG. 4 is a flow diagram of a method of imaging according to another aspect of the invention.

According to an aspect of the present invention, there is provided a method of imaging of the specimen 16 exposed to an electron beam signal. Referring now to the flow diagram of FIG. 4, the method may initially include a step of exposing 200 the specimen 16 to the electron beam signal. The method further includes the step of acquiring 210 an image sequence of sequential images of the specimen 16. Each subsequent image in the image sequence represents increased cumulative electron beam signal exposure on the specimen 16. The method further includes the step of selectively discarding 220 images in the image sequence where the images do not have sufficient correspondence with other images in the image sequence. The method further includes the step of combining 230 a remainder of the images to produce a final image. As discussed below, the foregoing method of imaging that discards initial images is particularly adapted for compensating or correcting of the "charging" type radiation damage upon the specimen 16 that occurs when the specimen 16 is initially exposed to the electron beam 14.

As a specimen is exposed to the electron beam during imaging, the specimen undergoes changes due to its interaction with the high-energy electrons from the microscope or camera. The present invention recognizes that at the beginning of each exposure, the electronic properties of the specimen 16 may change (often known as "charging"). These changes may affect the diameters, shapes, or amplitude uniformity (isotropicity) of Thon rings. The two-dimensional Fourier transform is a mathematical technique that transforms an image between the spatial domain (in which each pixel 24 represents information at a particular location) and the frequency domain (in which each pixel 24 represents the total information across the entire image at a particular frequency). The two-dimensional Fourier transform of a TEM image has specific characteristics imparted by the contrast transfer function (CTF) of the microscope. For example, the two-dimensional Fourier transform of TEM images collected out-of-focus show a pattern of concentric rings (called Thon rings). The diameters of these rings are dependent on the amount that the image is out-of-focus. The diameters of the Thon rings corresponding to one image may be compared to the diameters of the Thon rings of another image of the image sequence. The amplitudes (or brightness) of these rings are dependent on the amount of information (signal-to-noise ratio) at the corresponding spatial frequency (resolution). Uniformity of the brightness of the Thon rings (with regard to angular positioning about the Thon rings) may be used for comparison. Further, the overall shape (circular versus oval) of the Thon rings is an indication of varying degrees of radiation damage. Also, the central bright center of the Thon rings may demonstrate differing shapes and brightness as between the corresponding images. All of these parameters and/or combinations and relative weighting may be used to make the determining of correspondence between images.

As indicated above, the method includes the step of selectively discarding 220 images in the image sequence where the images do not have sufficient correspondence with other images in the image sequence. In this regard, a filter may be applied to determine whether to discard an image using any of those techniques that are well known to one of ordinary skill in the art when considering the various parameters of the corresponding Thon rings. According to various embodiments, the correspondence between images in the image sequence is determined by comparison of a two-dimensional Fourier transform of the discarded images with a two-dimensional Fourier transform of selected ones of a remainder of the images. The selectively discarding images includes comparing a two-dimensional Fourier transform of the discarded images with a two-dimensional Fourier transform of selected ones of a remainder of the images. The discarded images may include images from a beginning of the image sequence.

According to various embodiments, the step of acquiring 110 of the image sequence may be by an electron detector, such as detector 20. Further, the electron detector is a direct bombardment detector. The acquiring 110 of the image sequence is by using an electron detector to collect a continuous stream of images. The continuous stream of images may be acquired at at least 5 frames per second (fps). The cumulative exposure on the specimen 16 over an entirety of the image sequence may be between 10 and 100 electrons per square Ångström ($e^-/Å^2$).

The acquisition of an image sequence from a camera such as the camera 10 may be utilized to correct for the physical motion of a specimen in the course of an electron exposure. Specimen motion during acquisition of an electron image results in blurring of the image and significantly reduces its quality. The specimen motion may be uniform in direction and magnitude across the entire image, or it may differ for various specimen particles or regions-of-interest within an image. Using a sequence of multiple images acquired with a direct detection camera such as camera 10, specimen motion may be corrected, by tracking the specimen position in each image, either using the entire image area or a smaller region-of-interest from each image. Effects of fixed pattern noise from the electron detector may be attenuated by filtering each image in the image sequence to down weight the components of the image most affected by fixed pattern noise. Tracking the specimen position can be facilitated by combining multiple images in the image sequence (by addition or averaging of pixel values) in order to boost the contrast of the specimen 16. The position of the specimen in the resulting combination of images can be assigned to either all the images used in the combination or to only the middle image in the combination. In the former case, the entire image sequence is grouped into a collection of discrete images for the purposes of specimen alignment, and in the latter case, the entire image sequence is used to generate a collection of images representing a rolling average of the image sequence. In any case, the final image sequence to be aligned can be low-pass or band-pass filtered to accentuate the contrast of the specimen 16. Comparisons between the images in the sequence to each other or to a reference image reveal the relative specimen motion throughout the image sequence. Each image in the sequence can therefore be shifted so that the specimen position matches across all images in the sequence prior to combining the sequence of images into a single final image. Following such a procedure reduces blurring from specimen motion, but does not account for other dynamic specimen processes such as radiation damage.

According to another aspect of the invention, there is provided a camera 10 as described according to any of the embodiments described herein. According to yet another aspect of the invention, there is provided a detector 20 as described according to any of the embodiments described herein.

The particulars shown herein are by way of example and for purposes of illustrative discussion of the embodiments of the present disclosure only and are presented in the cause of providing what is believed to be the most useful and readily understood description of the principles and conceptual aspects of the disclosure. In this regard, no attempt is made to show more details than is necessary for a fundamental understanding of the disclosure, the description taken with the drawings making apparent to those skilled in the art how the several forms of the presently disclosed methods may be embodied in practice.

What is claimed is:

1. A method of imaging of a specimen exposed to an electron beam signal, the method comprising the steps of:
    acquiring an image sequence of sequential images of the specimen, each subsequent image in the image sequence representing increased cumulative electron beam signal exposure on the specimen;
    collecting cumulative exposure data for each image of the image sequence;
    applying a low-pass image processing filter to the images of the image sequence using the cumulative exposure data corresponding to each image to which the filter is being applied to produce processed images; and
    combining the processed images to produce a final image.

2. The method of claim 1 further includes:
    exposing the specimen to the electron beam signal.

3. The method of claim 1 wherein the acquiring of the sequence is by an electron detector.

4. The method of claim 3 wherein the electron detector is a direct bombardment detector.

5. The method of claim 1 wherein the acquiring of the image sequence is by using an electron detector to collect a continuous stream of images.

6. The method of claim 5 wherein the continuous stream of images is acquired at at least 5 frames per second (fps).

7. The method of claim 1 where the cumulative exposure on the specimen over an entirety of the image sequence is between 10 and 100 electrons per square Ångström ($e^-/Å^2$).

8. The method of claim 1 wherein the low-pass image processing filter is characterized by a filter strength, the filter strength is increased for each subsequent image in the image sequence.

9. The method of claim 1 wherein the low-pass image processing filter is selectively applied to images of the image sequence.

10. The method of claim 9 wherein the low-pass image processing filter is not applied to initial ones of the images of the image sequence.

11. The method of claim 1 wherein the continuous stream of images is acquired at at least 5 frames per second (fps).

12. A method of imaging of a specimen exposed to an electron beam signal, the method comprising the steps of:
    acquiring an image sequence of sequential images of the specimen by using an electron detector to collect a continuous stream of images, each subsequent image in the image sequence representing increased cumulative electron beam signal exposure on the specimen;
    selectively discarding images in the image sequence where the images do not have sufficient correspondence with other images in the image sequence; and
    combining a remainder of the images to produce a final image.

13. The method of claim 12 wherein correspondence between images in the image sequence is determined by comparison of a two-dimensional Fourier transform of the discarded images with a two-dimensional Fourier transform of selected ones of a remainder of the images.

14. The method of claim 12 wherein the selectively discarding includes comparing a two-dimensional Fourier transform of the discarded images with a two-dimensional Fourier transform of selected ones of a remainder of the images.

15. The method of claim 12 wherein the discarded images includes images from a beginning of the image sequence.

16. The method of claim 12 further includes:
    exposing the specimen to the electron beam signal.

17. The method of claim 12 wherein the acquiring of the sequence is by an electron detector.

18. The method of claim 17 wherein the electron detector is a direct bombardment detector.

19. The method of claim 12 wherein the cumulative exposure on the specimen over an entirety of the image sequence is between 10 and 100 electrons per square Ångström ($e^-/Å^2$).

* * * * *